United States Patent
Butler et al.

(10) Patent No.: US 9,927,721 B2
(45) Date of Patent: Mar. 27, 2018

(54) OBJECT POSITIONING SYSTEM, CONTROL SYSTEM, LITHOGRAPHIC APPARATUS, OBJECT POSITIONING METHOD AND DEVICE MANUFACTURING METHOD

(71) Applicant: ASML Netherlands B.V., Veldhoven (NL)

(72) Inventors: Hans Butler, Best (NL); Wilhelmus Henricus Theodorus Maria Aangenent, Eindhoven (NL); Nic Jasper Dirkx, 's Hertogenbosch (NL); Ramidin Izair Kamidi, Eindhoven (NL); Wilhelmus Franciscus Johannes Simons, Beesel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/314,440

(22) PCT Filed: May 1, 2015

(86) PCT No.: PCT/EP2015/059625
§ 371 (c)(1),
(2) Date: Nov. 28, 2016

(87) PCT Pub. No.: WO2015/185301
PCT Pub. Date: Dec. 10, 2015

(65) Prior Publication Data
US 2017/0199468 A1    Jul. 13, 2017

(30) Foreign Application Priority Data
Jun. 3, 2014 (EP) .................................... 14171005

(51) Int. Cl.
*G03F 7/20* (2006.01)
*G03F 9/00* (2006.01)

(52) U.S. Cl.
CPC ...... *G03F 7/70725* (2013.01); *G03F 7/70775* (2013.01); *G03F 9/7088* (2013.01); *G03F 9/7092* (2013.01)

(58) Field of Classification Search
CPC ............. G03F 7/70725; G03F 7/70775; G03F 9/7088; G03F 9/7092
See application file for complete search history.

(56) References Cited

U.S. PATENT DOCUMENTS

| 7,327,437 B2 | 2/2008 | Cox et al. |
| 7,379,156 B2 | 5/2008 | Kunst et al. |

(Continued)

FOREIGN PATENT DOCUMENTS

| CN | 101464634 | 6/2009 |
| JP | 2006-165564 | 6/2006 |

(Continued)

OTHER PUBLICATIONS

International Search Report and Written Opinion dated Oct. 22, 2015 in corresponding International Patent Application No. PCT/EP2015/059625.

(Continued)

*Primary Examiner* — Michelle M Iacoletti
(74) *Attorney, Agent, or Firm* — Pillsbury Winthrop Shaw Pittman, LLP (57) ABSTRACT

An object positioning system including a movable object, an actuator system and a control system. The moveable object is moveable relative to a reference. The actuator system is configured to apply a force to the object at a force application location on the object in order to move the moveable object relative to the reference. The control system is configured to position a point of interest of the object relative to the reference. The control system is configured to drive the actuator system based on a parameter representing (Continued)

a spatial relationship between the force application location and the point of interest. The parameter is dependent on a further parameter representing a position of the object relative to the reference.

20 Claims, 7 Drawing Sheets

(56) References Cited

U.S. PATENT DOCUMENTS

| | | | |
|---|---|---|---|
| 7,742,149 | B2 | 6/2010 | De Vos et al. |
| 7,948,609 | B2 | 5/2011 | Schneiders et al. |
| 8,922,756 | B2 | 12/2014 | Koenen et al. |
| 2006/0119829 | A1 | 6/2006 | Cox et al. |
| 2006/0139590 | A1 | 6/2006 | Kunst et al. |
| 2009/0231566 | A1 | 9/2009 | Schneiders et al. |

FOREIGN PATENT DOCUMENTS

| | | |
|---|---|---|
| JP | 2008-300828 | 12/2008 |
| JP | 2013-079939 | 5/2013 |
| NL | 20022789 A1 * | 4/2009 |
| NL | 1040514 | 6/2014 |

OTHER PUBLICATIONS

J.J.M. Lunenburg, "Inversion-Based Feedforward Design for Beyond Rigid Body Systems: A Literature Survey," Philips Applied Technologies Mechatronics Program, Drives and Control Group, Eindhoven University of Technology, Department of Mechanical Engineering, Control Systems Technology Group, pp. 1-72 (Nov. 2009).

Chinese Office Action dated Aug. 25, 2017 in corresponding Chinese Patent Application No. 201580029069.X.

Japanese Office Action dated Oct. 24, 2017 in corresponding Japanese Patent Application No. 2016-571216.

* cited by examiner

OBJECT POSITIONING SYSTEM, CONTROL SYSTEM, LITHOGRAPHIC APPARATUS, OBJECT POSITIONING METHOD AND DEVICE MANUFACTURING METHOD

CROSS-REFERENCE TO RELATED APPLICATIONS

This application is the U.S. national phase entry of PCT patent application no. PCT/EP2015/059625, which was filed on May 1, 2015, which claims the benefit of priority of EP application no. 14171005.3, which was filed on Jun. 3, 2014, and which is incorporated herein in its entirety by reference.

BACKGROUND

Field of the Invention

The present invention relates to an object positioning system, a control system, a lithographic apparatus, a method for positioning an object and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus usually comprises one or more objects that need to be accurately positioned such as a support constructed to support the patterning device and/or a substrate table constructed to hold a substrate. The lithographic apparatus therefore preferably comprises an object positioning system for positioning a moveable object relative to a reference, comprising:

an actuator system configured to apply a force to the object in order to move the moveable object relative to the reference;

a measurement system configured to measure a position of the object relative to the reference; and a control system configured to position the object relative to the reference based on an output of the measurement system by driving the actuator system.

With the increasing demand for higher throughput, the accelerations applied to the object also increase. This will result in excitation of internal dynamical modes of the object, such as a torsion mode and an umbrella mode. These internal dynamical modes may limit the obtainable accuracy of the object positioning system.

SUMMARY

It is desirable to provide an object positioning system, in particular for a lithographic apparatus, with improved performance, i.e. with an improved accuracy.

According to an embodiment of the invention, there is provided an object positioning system comprising a movable object, an actuator system and a control system. The moveable object is moveable relative to a reference. The actuator system is configured to apply a force to the object at a force application location on the object in order to move the moveable object relative to the reference. The control system is configured to position a point of interest of the object relative to the reference. The control system is configured to drive the actuator system based on a parameter representing a spatial relationship between the force application location and the point of interest. The parameter is dependent on a further parameter representing a position of the object relative to the reference.

According to a further embodiment of the invention, there is provided a control system configured for use in the object positioning system.

According to a further embodiment of the invention, there is provided a lithographic apparatus comprising the object positioning system.

According to a further embodiment of the invention, there is provided a method for positioning an object. The method comprises the following steps:

a) positioning a point of interest of the object relative to a reference;

b) applying a force to the object at a force application location on the object;

c) applying the force based on a spatial relationship between the force application location and the point of interest, wherein the spatial relationship is dependent on a position of the object relative to the reference.

According to a further embodiment, there is provided a device manufacturing method wherein use is made of the object positioning system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
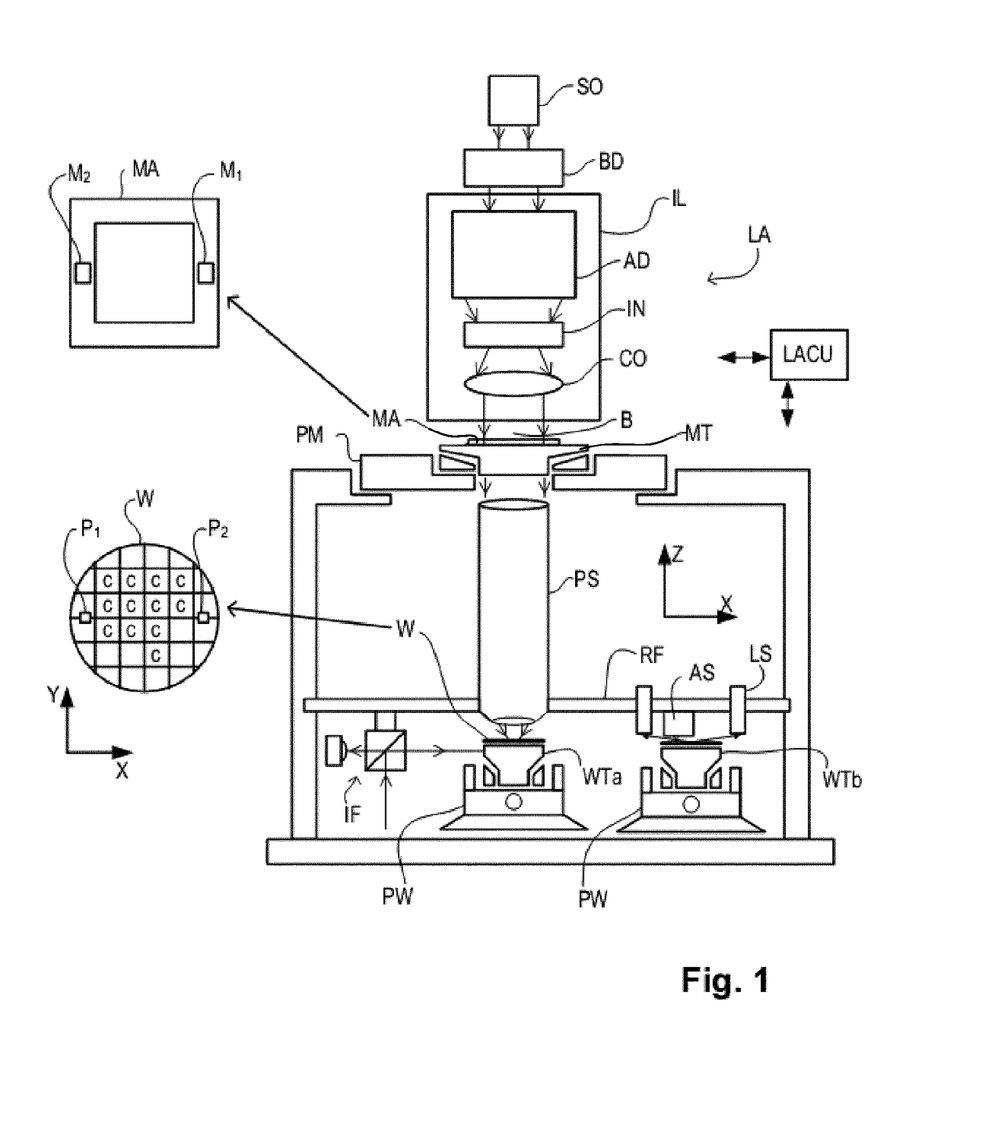
FIG. 1 depicts a lithographic apparatus according to an embodiment of the invention.

FIG. 1 schematically depicts a lithographic apparatus LA according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device PA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables) or one substrate table and one calibration stage. In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

As described above, the mask table MT and the substrate table WTa/WTb are examples of objects within the lithographic apparatus that may need to be positioned (accurately) relative to a reference, e.g. the projection system PS. Another example of an object that may be positionable is an optical element in the projection system PS.

In order to position objects relative to a reference within the lithographic apparatus, the lithographic apparatus comprises one or more object positioning systems according to the invention, which will be described in more detail below. Although in the remainder of this description the general term "object" may be used, it will be apparent that this term can be replaced by substrate table WT, mask table MT, optical element, projection system PS, etc., where applicable.

Figure 2:
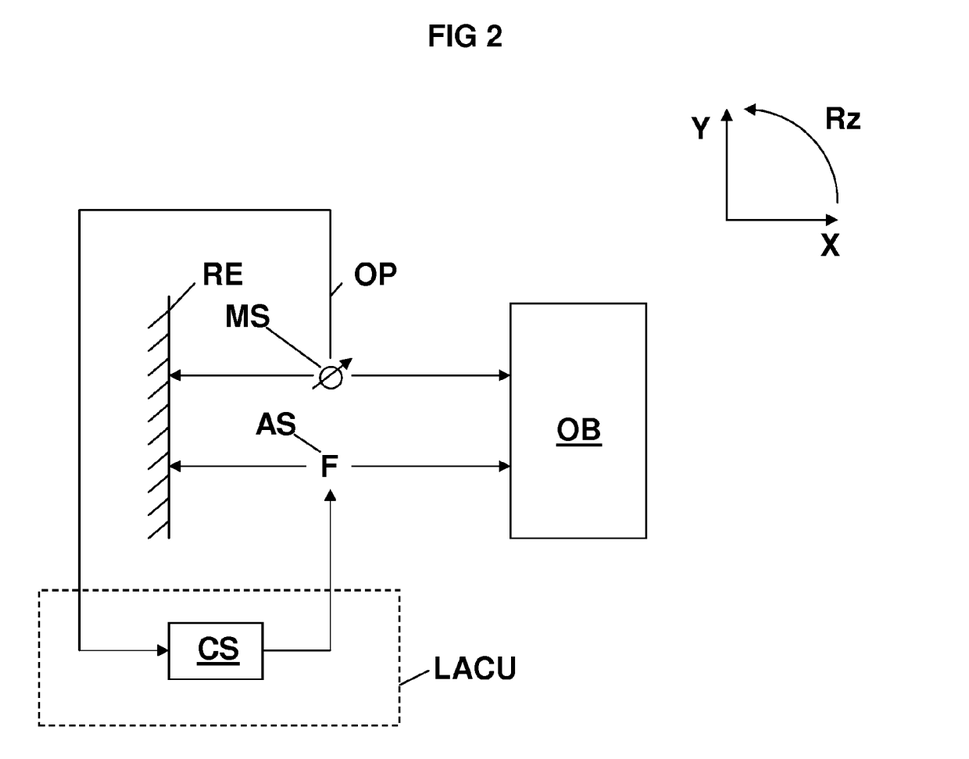
FIG. 2 depicts schematically an object positioning system according to an embodiment of the invention.

An object positioning system according to the invention is schematically depicted in FIG. 2 and comprises:

an object OB, e.g. a substrate table WT or mask table MT as shown in FIG. 1, to be positioned relative to a reference RE, e.g. a projection system PS;

an actuator system AS configured to apply a force F to the object OB in order to move the object OB relative to the reference RE;

a measurement system MS configured to measure a position of the object OB relative to the reference RE, which measurement system MS may comprise one or more sensors, e.g. position sensors IF of FIG. 1;

a control system CS configured to position a point of interest of the object OB relative to the reference RE based on an output OP of the measurement system MS by driving the actuator system AS.

In FIG. 2 the actuator system AS is shown to apply a force F between the object OB and the reference RE, however, it is not necessary per se that the force F is applied to the reference RE. In order to minimize disturbances as a result of the applied force F, a so-called separate force frame may be provided which is uncoupled from the reference RE allowing to apply a force F to the object OB without disturbing the reference RE which is used by the measurement system MS to determine the position of the object OB relative to the reference RE.

In FIG. 2 the measurement system MS is shown to measure the position of the object OB relative to the reference RE. Although FIG. 2 may suggest that a direct measurement is performed, it is also possible that the measurement system is configured to measure the position of the object relative to another structure. The measurement system MS may be considered to measure the position of the object in one or more degrees of freedom relative to the reference RE as long as this position can be deducted from the output OP of the measurement system MS. Examples of degrees of freedom which can be measured by the measurement system MS are a X-direction, a Y-direction perpendicular to the X-direction, and a rotational direction Rz about an axis perpendicular to both the X- and Y-direction, commonly referred to as the Z-direction. The output OP may be any type of measurement signal representative of a position of the object OB relative to the reference RE.

The control system CS may be part of lithographic apparatus control unit LACU as also depicted in FIG. 1. Exemplary embodiments of the control system CS of FIG. 2 will be given below.

Figure 3:
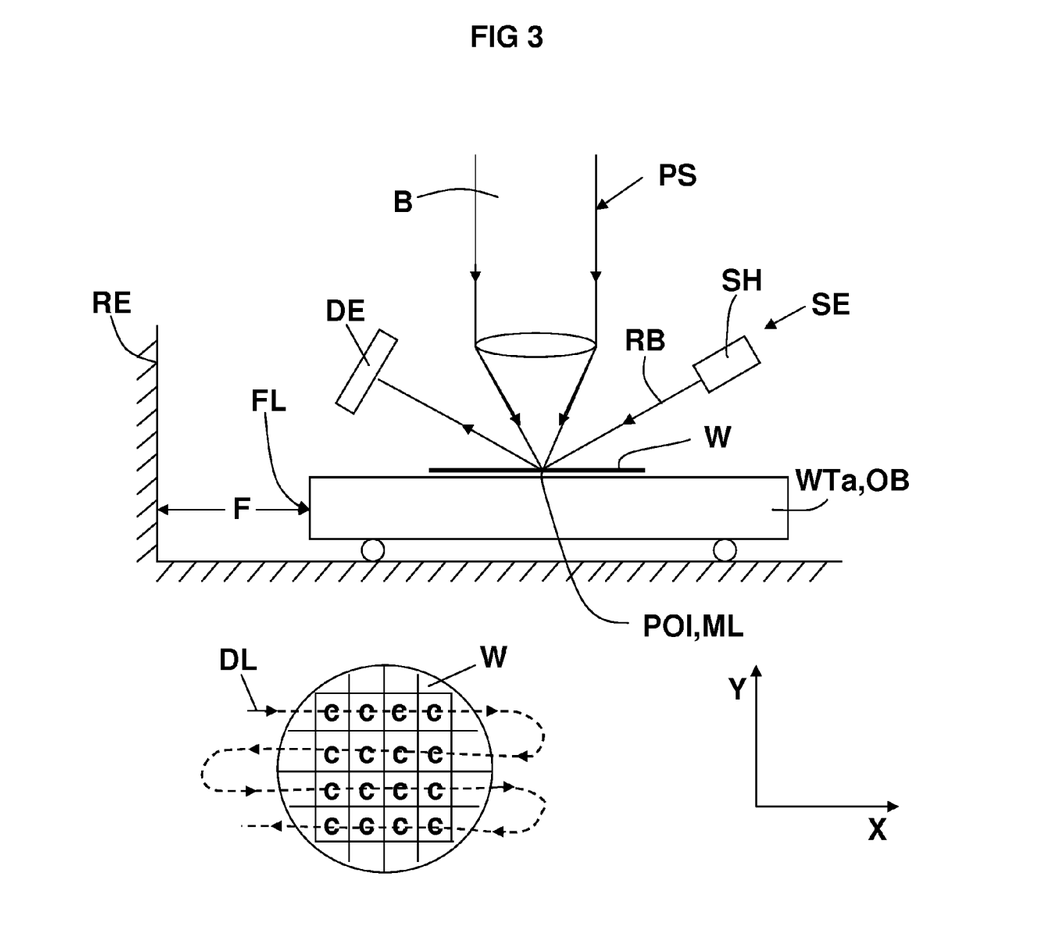
FIG. 3 depicts an object positioning system according to another embodiment of the invention.

FIG. 3 schematically depicts a substrate table WTa acting as an object OB according to the invention. The substrate table WTa is configured to support a substrate W. FIG. 3 also depicts a top view of a substrate W showing several target portions C.

FIG. 3 further depicts a part of the projection system PS configured to focus a radiation beam B onto a target portion C of the substrate W. The target portion C of the substrate W to be illuminated by the radiation beam B is considered to be the point of interest POI. In this embodiment, there are multiple target portions C on the substrate W and the target portions C are consecutively illuminated by the radiation beam by scanning the radiation beam across the wafer in a moving pattern as for instance shown using a dashed line DL in the top view of the substrate W. Hence, in this embodiment the point of interest POI is not a stationary location on the object OB, but constantly changes during scanning across the substrate W.

FIG. 3 also depicts a sensor SE which is part of a measurement system measuring the position of the substrate W and thus indirectly the position of the substrate table WTa. The sensor SE comprises a sensor head SH with a radiation source for emitting a radiation beam RB towards the substrate W. The radiation beam RB is reflected of a surface of the substrate W towards a detector DE which processes the incoming reflected radiation beam to derive a position of the substrate W. The surface may for instance comprise a grating (not shown) allowing to determine the position of the substrate in X-direction, Y-direction and/or Z-direction depending on the type and configuration of the grating, the sensor head SH and the detector DE.

An advantage of the sensor SE in FIG. 3 is that the position of the substrate W is measured at a measurement location ML that is substantially at the point of interest POI. This means that any deformation of the substrate table WTa caused by applying forces to the substrate table WTa are measured by the measurement system at the point of interest POI and thus no correction is required taking into account the difference in deformation at the point of interest POI and deformation at the measurement location ML as there is no such difference.

Alternatively, the sensor SE may be configured to measure a position of the object OB at a side opposite to the side where the substrate W is supported by the substrate table WTa, such that the measurement location is directly beneath the point of interest POI. In an embodiment of such a sensor, a grating is provided on the bottom of the object OB cooperating with an encoder head.

An actuator system (not shown in FIG. 3) is used to move the substrate table WTa and thus the substrate W accurately, so as to position the different target positions C in the path of the radiation beam B. This actuator system therefore applies at least a force F to the substrate table WTa at a force application location FL. In the example of FIG. 3, the force application location FL is stationary relative to the substrate table WTa.

Due to the point of interest POI moving across the substrate W, the deformations of the substrate table WTa at the point of interest POI caused by the force F are dependent on the position of the substrate table WTa, or in other words, the spatial relationship between force application location FL and point of interest POI is dependent on the position of the substrate table WTa relative to a reference RE. The spatial relationship may include a compliance between the force application location and the point of interest. The compliance may indicate the amount of displacement of the point of interest POI relative to the force application location FL caused by a deformation of the substrate table WTA due to the force F applied to the force application location FL.

Although in this specific embodiment the position-dependency of the spatial relationship is caused by the change of position of the point of interest POI relative to a stationary force application location FL, there are also embodiments envisaged in which the position-dependency of the spatial relationship is caused by the change of position of the force application location FL relative to a stationary point of interest POI. Further, there exist embodiments in which both the point of interest POI and force application location FL change with the position of the object. The spatial relationship between the force application location FL and the point of interest POI is also considered to be dependent on the position of the object OB in case the mutual spacing between the force application location FL and the point of interest POI is not changing, but the location of both the force application location FL and the point of interest POI on the object OB is dependent on the position of the object OB, because the behavior at the point of interest POI due to forces applied at the force application location FL is then different for different positions of the object OB.

Figure 4:
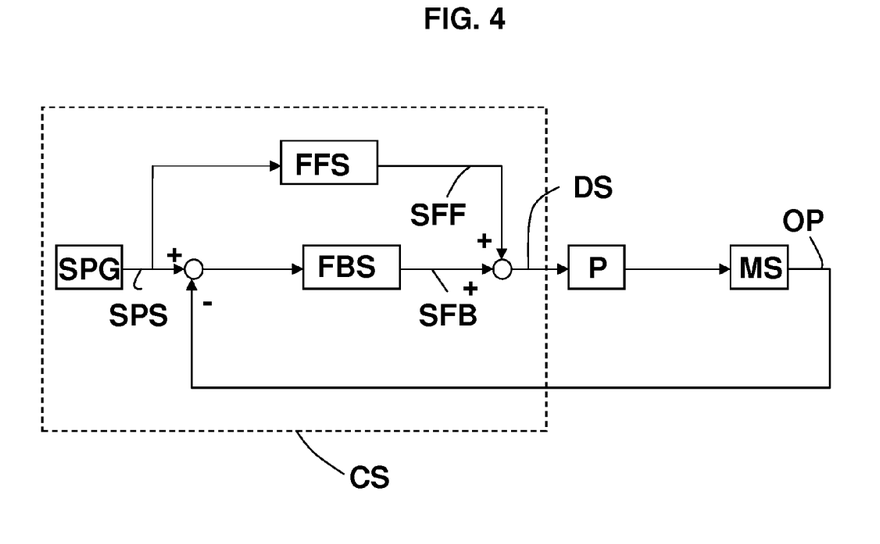
FIG. 4 depicts a control scheme suitable for an object positioning system according to FIG. 3.

FIG. 4 depicts a block diagram that is representative for an object positioning system according to an embodiment of the invention, in particular suitable for the embodiment shown in FIG. 3. The block diagram comprises a block P that is representative for the actual behavior of the object OB to be positioned and includes the behavior of an actuator system applying a force to the object OB in order to move the object OB relative to a reference RE.

The position of the object is measured by a measurement system MS and an output OP of the measurement system MS is provided to a control system CS. The control system CS comprises a set-point generator SPG to generate a set-point signal SPS representative for a desired position of a point of interest POI on the object.

The control system CS further comprises a feedforward system FFS configured to generate a feedforward signal SFF based on the set-point signal SPS, and a feedback system FBS configured to generate a feedback signal SFB based on the set-point signal SPS and the output OP of the measurement system MS.

The control system CS combines the feedforward signal SFF and the feedback signal SFB into a drive signal DS to drive the actuator system of block P.

The invention is based on the insight that due to the flexibility of the object OB, applying a force F to the object OB will cause the object OB to deform and thus may change the position of the point of interest POI depending on the excited modes and the position of the point of interest POI, so that the point of interest POI is not behaving as expected compared to an infinitely rigid object. Hence, the inventors found that applying a feedforward signal SFF based on the set-point signal SPS, assuming an infinitely rigid object, will result in increased settling errors due to the actual deformation of the object OB.

To avoid these increased settling errors, the invention uses a feedforward signal SFF that is dependent on a spatial relationship between the force application location FL and the point of interest POI, wherein the spatial relationship is dependent on the position of the object OB relative to the reference RE as shown above. Hence, in this way, the feedforward signal SFF takes the compliance of the object OB into account, so that the point of interest POI is closer to the desired position represented by the set-point signal SPS and thus the accuracy of the positioning is improved and settling errors and time are reduced.

In an embodiment, this can be implemented by using parameters in the feedforward system FFS that are dependent on the actual position of the object OB relative to the reference RE, in which case the output OP of the measurement system MS is also used as input to the feedforward system FFS. However, in order to avoid stability problems, it is preferred that the parameters are dependent on the desired position of the object OB and thus the set-point signal SPS is used as input to the feedforward system FFS for this purpose as well.

Figure 5:
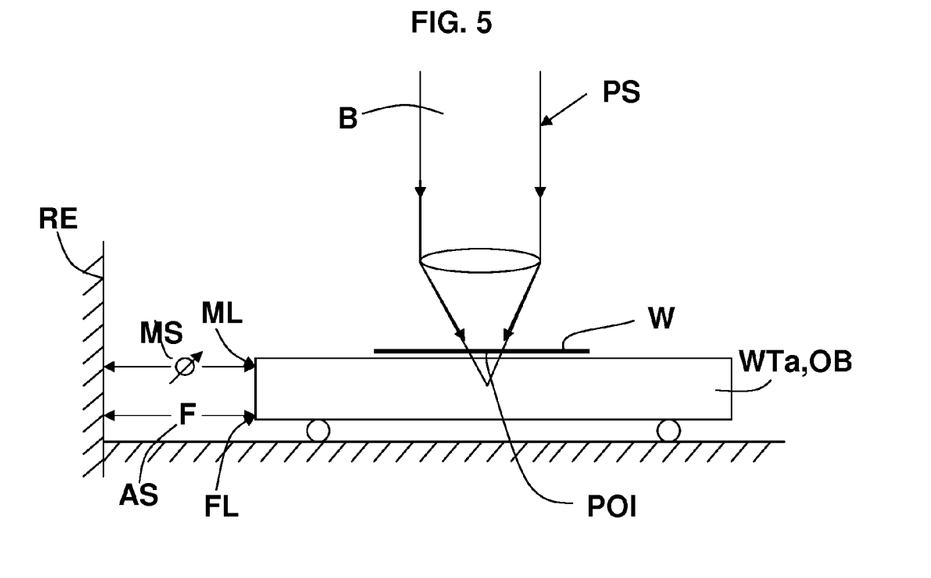
FIG. 5 depicts an object positioning system according to a further embodiment of the invention.

FIG. 5 depicts schematically an object positioning system according to another embodiment of the invention and shows an object OB that is similar to a substrate table WTa of FIG. 1, an actuator system AS to move the object relative to a reference RE by applying a force F at a force application location FL, and a measurement system MS to measure a position of the object OB relative to the reference RE at a measurement location ML.

The substrate table WTa is configured to support a substrate W. A radiation beam B is focused on a target portion of the substrate W by a projection system PS, so that the position of the target portion to be illuminated is the point of interest POI of the substrate W and thus the object OB.

Figure 6:
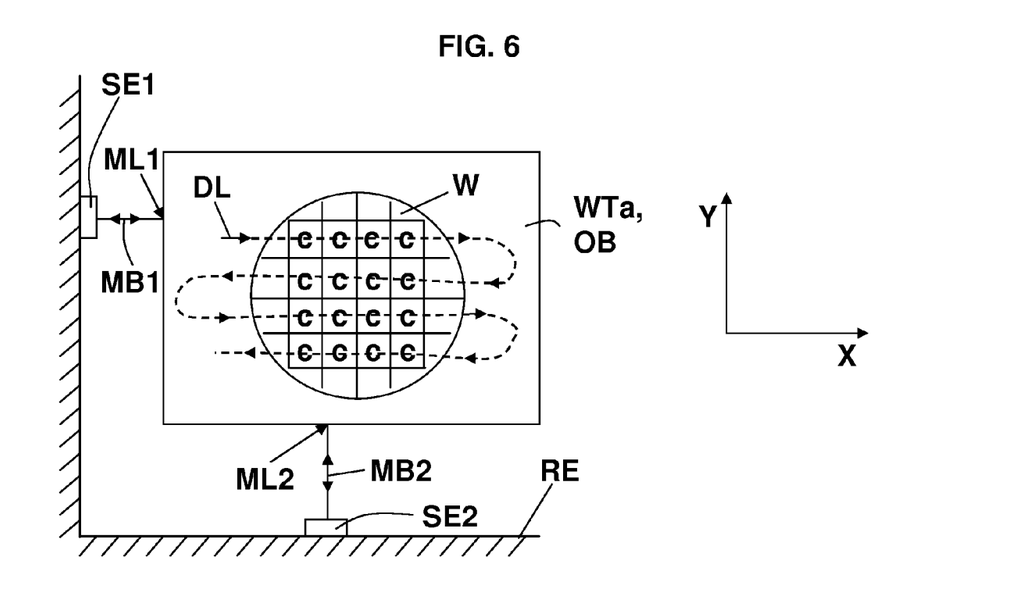
FIG. 6 depicts a top view of a part of the object positioning system of FIG. 5.

FIG. 6 depicts a top view of the object OB supporting the substrate W. In this view, the substrate W is shown having multiple target portions C that are to be illuminated consecutively, for instance by moving the substrate W beneath the projection system PS in a pattern indicated by dashed line DL. In order to move the object OB in accordance with the pattern DL, the object OB needs to be moved in both X- and Y-direction and thus the position of the object OB also needs to be measured in these directions.

FIG. 6 further shows that the measurement system comprises a first sensor SE1 for measuring a position of the object OB in the X-direction and a second sensor SE2 for measuring a position of the object OB in the Y-direction. Both sensors SE1, SE2 are stationary with respect to the reference RE and direct a respective measurement beam MB1, MB2 towards the object, so that they define respective measurement locations ML1 and ML2 on the object OB, which measurement locations ML1, ML2 change with the position of the object. For instance, moving the object OB in the X-direction will move the measurement location ML2 along the object OB in the X-direction. The same holds for measurement location ML1 when moving the object OB in the Y-direction.

Applying a force F as input to the object OB may excite internal dynamic modes of the object OB resulting in deformation of the object OB. As the position of the object OB is not measured in the point of interest POI, but at the measurement locations ML1, ML2, the measured deformation may not correspond to the deformation at the point of interest POI resulting in position inaccuracies.

Further, the point of interest POI and the measurement locations ML1, ML2 vary with the position of the object OB, so that the deformations caused by the actuator system AS also vary. Hence, the spatial relationship between force application location FL and measurement location ML1, ML2 and the spatial relationship between force application location FL and point of interest POI are dependent on the position of the object OB relative to the reference RE. As a result, the difference between the spatial relationship between force application location FL and point of interest POI and the spatial relationship between force application location FL and measurement location ML1, ML2, which is representative for the difference in deformation at the measurement location ML1, ML2 and the deformation at the point of interest POI, may also be dependent on the position of the object OB relative to the reference RE.

Figure 7:
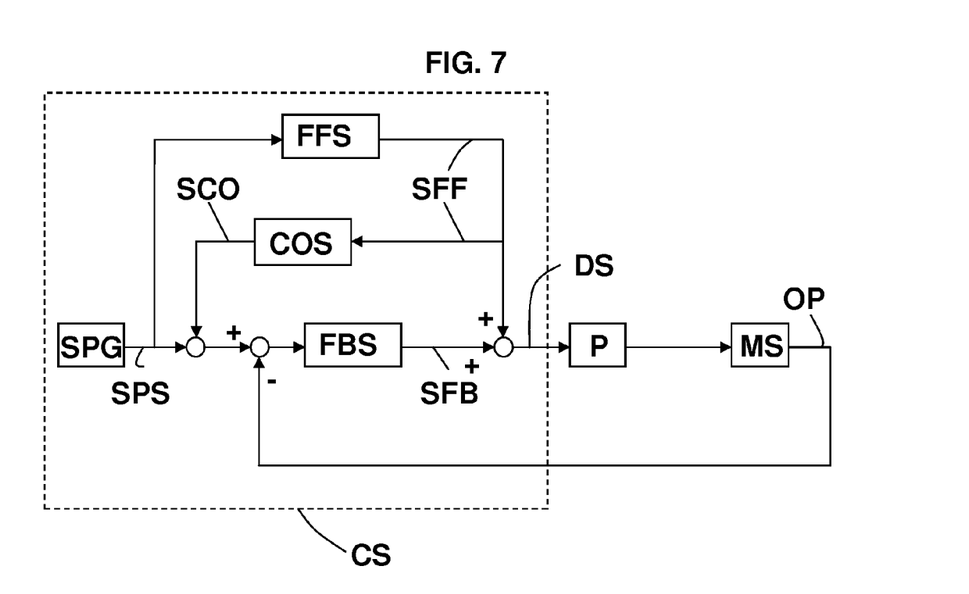
FIG. 7 depicts a control scheme suitable for an object positioning system according to FIGS. 5 and 6.

FIG. 7 depicts a block diagram that is representative for an object positioning system according to an embodiment of the invention, in particular suitable for the embodiment shown in FIGS. 5 and 6. The block diagram comprises a block P that is representative for the actual behavior of an object OB to be positioned and includes the behavior of the actuator system AS applying a force F to the object OB in order to move the object OB relative to a reference RE.

The position of the object OB is measured by a measurement system MS and an output OP of the measurement system MS is provided to the control system CS. The control system CS comprises a set-point generator SPG to generate a set-point signal SPS representative for a desired position of a point of interest POI on the object OB.

The control system CS further comprises a feedforward system FFS configured to generate a feedforward signal SFF based on the set-point signal SPS, and a feedback system FBS configured to generate a feedback signal SFB based on the set-point signal SPS and the output OP of the measurement system MS.

The control system CS combines the feedforward signal SFF and the feedback signal SFB into a drive signal DS to drive the actuator system AS of block P.

Due to the flexibility of the object OB, applying a force F as input to the object OB will cause the object OB to deform and thus may change the position of the point of interest POI depending on the excited modes and the position of the point of interest POI, so that the point of interest POI is not behaving as expected compared to an infinitely rigid object. Hence, applying a feedforward signal SFF based on the set-point signal SPS, assuming an infinitely rigid object, will result in increased settling errors due to the deformation of the object OB.

To avoid these increased settling errors, the invention uses a feedforward signal SFF that is dependent on a parameter representing a spatial relationship between the force application location FL and the point of interest POI, wherein the spatial relationship is dependent on the position of the object OB relative to the reference RE. Hence, in this way, the feedforward signal SFF takes the compliance of the object OB into account, so that the measured position of the point of interest POI better follows the set-point signal SPS and thus the accuracy of the positioning is improved.

In an embodiment, this can be implemented by at least one further parameter in the feedforward system FFS that depends on the actual position of the object OB relative to the reference RE, such that the output OP of the measurement system MS is also used as input to the feedforward system FFS. However, in order to avoid stability problems, it is preferred that the parameters are dependent on the desired position of the object OB and thus the set-point signal SPS is used as input to the feedforward system FFS for this purpose as well.

The control system CS further comprises a correction system COS configured to provide a correction signal SCO to the feedback system FBS based on the feedforward signal SFF and a difference between a spatial relationship between the force application location FL and the point of interest POI and a spatial relationship between the force application location FL and the measurement location ML1, ML2, wherein the difference is dependent on the position of the object OB relative to the reference RE.

In an embodiment, this can be implemented by using parameters in the correction system COS that are dependent on the actual position of the object OB relative to the reference RE, such that the output OP of the measurement system MS is also used as input to the correction system COS. However, in order to avoid stability problems, it is preferred that the parameters are dependent on the desired position of the object OB and thus the set-point signal SPS is used as input to the correction system COS for this purpose.

Hence, the feedforward system FFS takes into account the compliance of the object OB and thus the deformations at the point of interest POI caused by applying a force F at the force application location FL and the correction system COS takes into account the difference between the deformations at the point of interest POI and the deformations measured at the respective measurement location ML1, ML2.

Figure 8:
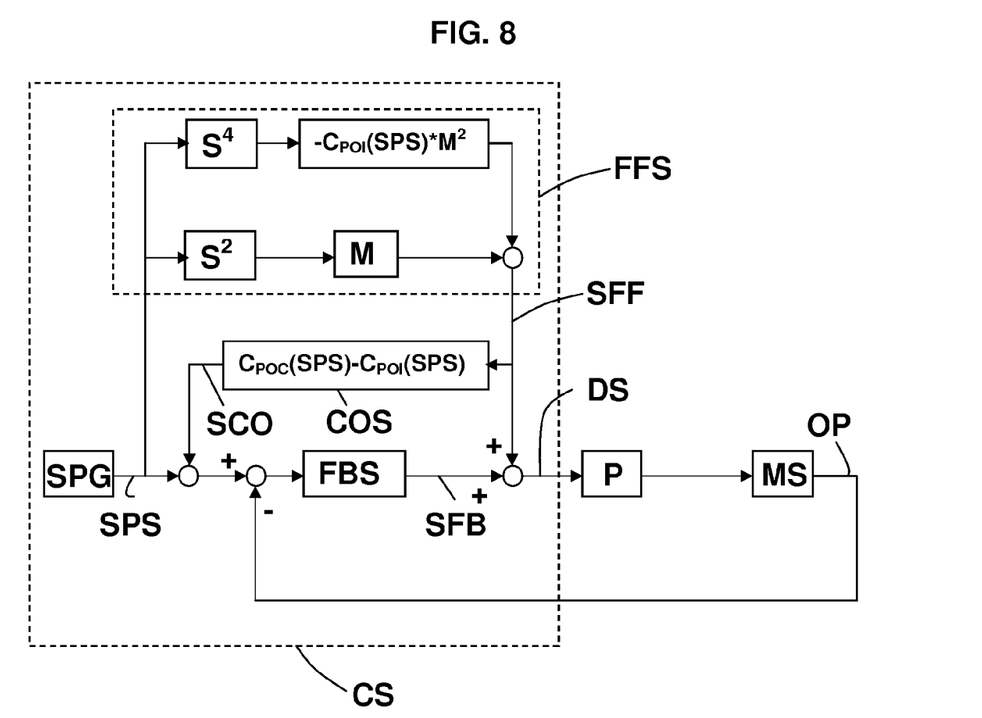
FIG. 8 depicts in more detail a practical embodiment of the control scheme of FIG. 7.

FIG. 8 depicts a more practical implementation of the control system CS of FIG. 7. The feedforward system FFS may for instance be limited to at most an order of 4, also referred to as snap feedforward. When the desired position of the point of interest POI is referred to as SPS, the feedforward signal SFF as a function of the desired position SPS may be calculated to be:

$$SFF/SPS = ms^2 - m^2 s^4 C_{poi}(SPS)$$

in which s is the complex argument of the Laplace transform and m is the mass of the object OB. $C_{poi}$ is a parameter that represents the position-dependent compliance between the force application location FL and the point of interest POI.

The correction signal SCO as a function of the feedforward signal SFF may be described as:

$$SCO/SFF = C_{poc}(SPS) - C_{poi}(SPS)$$

in which $C_{poc}$ is a parameter representing the position-dependent compliance between the force application location FL and the measurement location ML1, ML2. $C_{poi}$ is a parameter representing the position-dependent compliance between the force application location FL and the point of interest POI.

The above functions have been implemented in FIG. 8 to form the feedforward system FFS and the correction system COS.

The parameters $C_{poc}$ and/or $C_{poi}$ may be determined by using a finite element model or any other embedded computational model.

Figure 9:
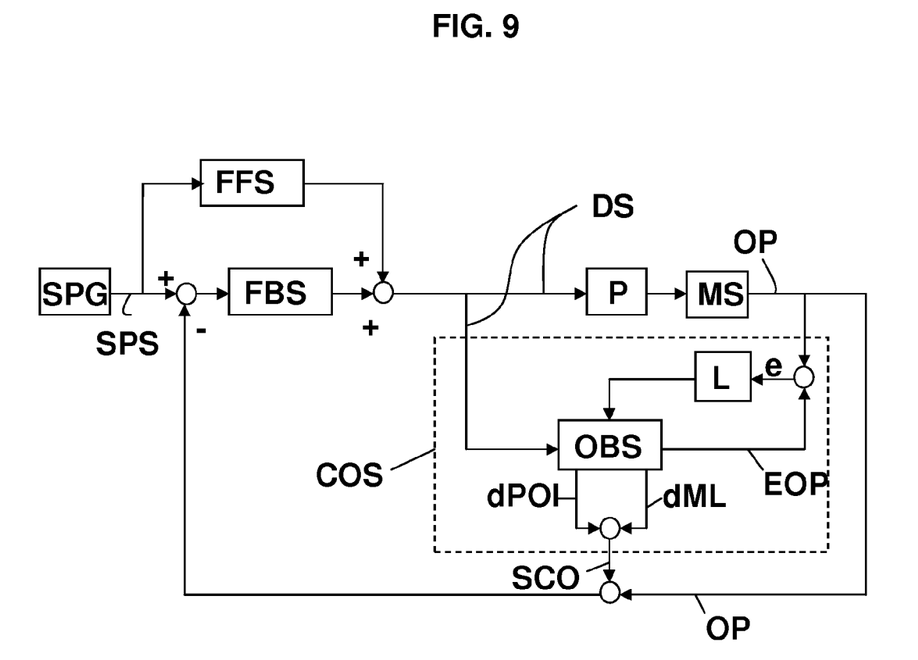
FIG. 9 depicts a control scheme for an object positioning system according to yet another embodiment of the invention.

FIG. 9 depicts an alternative embodiment in which $C_{poc}$ and $C_{poi}$ are determined in an alternative manner than by using a finite element model or other computational model. The control system of FIG. 9 uses a correction system COS with an observer OBS including a dynamical model of the object to estimate an internal dynamical behavior of the object based on the drive signal DS as input to the object, and the output OP of the measurement system MS, which output OP is provided to the observer OBS via signal e and gain L which will be explained in more detail below.

The observer OBS in this embodiment also includes a model of the measurement system MS and outputs an estimated output EOP which corresponds to the output OP of the measurement system MS. Due to differences between the actual dynamic behavior of the object and the dynamic model and/or external disturbances applied to the object, the estimated output EOP may differ from the actual output OP. The signal e is the difference between the output OP and the estimated output EOP. The error signal e is fed back to the observer OBS via gain L to compensate for the differences to bring the estimated output EOP in line with the output OP.

The dynamical model of the observer OBS includes the dependency of the spatial relationship between the force application location FL and the measurement location (ML, ML1, ML2) and the dependency of the spatial relationship between the force application location FL and the point of interest POI on the position of the object.

The dynamic model of the observer OBS may be represented by the following state space equations in which the states of the observer OBS are indicated by reference symbol $x_{OBS}$ and the dynamic model of the plant P and measurement system MS is represented by the matrices A', B' and C':

$$\frac{d}{dt}x_{OBS} = A' \cdot x_{OBS} + B' \cdot u + L(OP - EOP) \quad \Rightarrow \quad \text{state equation}$$

$$EOP = C' \cdot x_{OBS} \quad \Rightarrow \quad \text{output equation}$$

The term L(OP−EOP) is a correction term, which helps to reduce the effects due to differences between the dynamic model and the actual system P, MS, e.g. in the presence of discrepancies between A' and B' of the dynamic model and the A and B matrix of the actual system, respectively. The matrix L serves as a weighting matrix.

The position dependency of the observed internal dynamic behavior may be included by providing at least one coefficient of the output equation, in this case at least one coefficient of the C' matrix, to be dependent on the position of the object.

This may indicated by C'(p), wherein p is the position of the object in the at least one degree of freedom. Position p may be the measured position OP of the object or may be the set-point signal SPS. The set-point signal SPS as being the position p on which the output equation is dependent has the advantage that a more stable system is obtained.

In an embodiment, the weighting matrix L is also dependent on the position of the object in the at least one degree of freedom. Hence, the equations may be written as:

$$\frac{d}{dt}x_{OBS} = A' \cdot x_{OBS} + B' \cdot u + L(p) \cdot (OP - EOP) \quad => \text{ state equation}$$

$$EOP = C'(p) \cdot x_{OBS} \quad => \text{ output equation}$$

When e=OP−EOP, the following error equation can be formulated:

$$\frac{d}{dt}e = (A' - L(p) \cdot C'(p)) \cdot e$$

An advantage of making both the output equation as well as the weighting matrix dependent on the position of the object is that given A' and C' (p) an L(p) can be chosen such that the eigenvalues of (A'−L(p)*C'(p)) are constant, which means that the error behavior is independent of the position of the object.

When the states of the observer OBS are know it is possible to deduct the position of the point of interest POI and the position of the measurement location ML thereby determining the estimated deformations dPOI, dML caused by applying forces F as input to the object OB at the force application location FL, which can be used to correct the feedback system FBS to improve the accuracy of the object position system.

An advantage of using an observer OBS for determining the correction signal SCO is that the actual behavior of the object is taken into account when determining the correction signal SCO so that it is also possible to correct for disturbances.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the control system described above may take the form of a computer program containing one or more sequences of machine-readable instructions The descriptions above are intended to be illustrative, not limiting. Thus, it will be apparent to one skilled in the art that modifications may be made to the invention as described without departing from the scope of the claims set out below.

What is claimed is:

1. An object positioning system comprising:
 a moveable object that is moveable relative to a reference;
 an actuator system configured to apply a force to the object at a force application location on the object in order to move the moveable object relative to the reference;
 a control system configured to position a point of interest of the object relative to the reference,
 wherein the control system is configured to drive the actuator system based on a first parameter representing a spatial relationship between the force application location and the point of interest,
 wherein the first parameter is dependent on a further second parameter representing a position of the object relative to the reference.

2. The object positioning system of claim 1, wherein the spatial relationship comprises a compliance between the force application location and the point of interest.

3. The object positioning system of claim 1, wherein the further second parameter is based on a set-point signal or a measurement signal.

4. The object positioning system of claim 1, comprising a measurement system configured to measure at a measurement location on the object and to provide a measurement signal representing the position of the object relative to the reference,
 wherein the control system comprises:
 a set-point generator to generate a set-point signal representative of a desired position of the point of interest;
 a feedforward system configured to generate a feedforward signal based on the set-point signal; and
 a feedback system configured to generate a feedback signal based on the set-point signal and the measurement signal, and
 wherein the control system is configured to drive the actuator system based on the feedforward signal and the feedback signal.

5. The object positioning system of claim 4, wherein the feedforward signal is dependent on the first parameter.

6. The object positioning system of claim 4, wherein the control system further comprises a correction system configured to provide a correction signal to the feedback system based on the feedforward signal and a spatial relationship parameter, wherein the spatial relationship parameter represents a difference between a first spatial relationship and a second spatial relationship, wherein the first spatial relationship is between the force application location and the point of interest, and wherein the second spatial relationship is between the force application location and the measurement location.

7. The object positioning system of claim 6, wherein the spatial relationship parameter is dependent on the first parameter.

8. The object positioning system according to claim 6, wherein the correction system comprises a dynamical model to estimate an internal dynamic behavior of the object based on the set-point signal and the feedforward signal, wherein the correction signal is based on the estimated internal dynamic behavior.

9. The object positioning system according to claim 6, wherein the correction system comprises an observer with a dynamic model of the object to estimate an internal dynamic behavior of the object based on an input from the control system to the object and the measurement signal, wherein the dynamic model depends on the spatial relationship parameter, wherein the observer is arranged to provide the correction signal.

10. The object positioning system according to claim 4, wherein the feedforward system comprises a dynamic model to estimate an internal dynamical behavior of the object based on the set-point signal, wherein the feedforward signal is based on the estimated internal dynamic behavior.

11. A lithographic apparatus comprising an object positioning system according to claim 1.

12. A lithographic apparatus according to claim 11, further comprising:
   an illumination system configured to condition a radiation beam;
   a support constructed to support a patterning device, the patterning device being capable of imparting the radiation with a pattern in its cross-section to form a patterned radiation beam;
   a substrate table constructed to hold a substrate; and
   a projection system configured to project the patterned radiation beam onto the target portion, wherein the object positioning system comprises the support or the substrate table.

13. A method for positioning an object, the method comprising:
   positioning a point of interest of the object relative to a reference;
   applying a force to the object at a force application location on the object; and
   applying the force based on a spatial relationship between the force application location and the point of interest, wherein the spatial relationship is dependent on a position of the object relative to the reference.

14. The method of claim 13, comprising positioning the object in a lithographic apparatus.

15. A device manufacturing method wherein use is made of the method according to claim 13.

16. The method of claim 13, wherein the spatial relationship comprises a compliance between the force application location and the point of interest.

17. The method of claim 13, wherein the position of the object relative to the reference is based on a set-point signal or a measurement signal.

18. The method of claim 13, further comprising:
   measuring at a measurement location on the object and providing a measurement signal representing the position of the object relative to the reference;
   generating a set-point signal representative of a desired position of the point of interest;
   generating a feedforward signal based on the set-point signal; and
   generating a feedback signal based on the set-point signal and the measurement signal,
   wherein applying the force is based on the feedforward signal and the feedback signal.

19. The method of claim 18, wherein the feedforward signal is dependent on the spatial relationship between the force application location and the point of interest.

20. A non-transitory computer readable medium comprising instructions configured to cause a positioning system to at least:
   position a point of interest of a moveable object relative to a reference by driving an actuator system configured to apply a force to the object at a force application location on the object in order to move the moveable object relative to the reference, based on a first parameter representing a spatial relationship between the force application location and the point of interest, wherein the first parameter is dependent on a further second parameter representing a position of the object relative to the reference.

* * * * *